(12) United States Patent
Pasquier et al.

(10) Patent No.: US 10,554,315 B2
(45) Date of Patent: Feb. 4, 2020

(54) DEVICE AND METHOD FOR MONITORING AND CALIBRATING A SYSTEM FOR ACQUIRING AND/OR TRANSMITTING DATA

(71) Applicant: Airbus Operations SAS, Toulouse (FR)

(72) Inventors: Michel Pasquier, Savignac-Mona (FR); Roland Croyet, Toulouse (FR)

(73) Assignee: AIRBUS OPERATIONS SAS, Toulouse (FR)

( * ) Notice: Subject to any disclaimer, the term of this patent is extended or adjusted under 35 U.S.C. 154(b) by 0 days.

(21) Appl. No.: 16/417,957

(22) Filed: May 21, 2019

(65) Prior Publication Data

US 2019/0363805 A1    Nov. 28, 2019

(30) Foreign Application Priority Data

May 23, 2018   (FR) ..................... 18 54293

(51) Int. Cl.
*H04B 17/10* (2015.01)
*H04B 17/13* (2015.01)
*H04B 17/21* (2015.01)

(52) U.S. Cl.
CPC ........... *H04B 17/104* (2015.01); *H04B 17/13* (2015.01); *H04B 17/21* (2015.01)

(58) Field of Classification Search
CPC ....... H04B 17/104; H04B 17/21; H04B 17/13
See application file for complete search history.

(56) References Cited

U.S. PATENT DOCUMENTS 10,073,115 B1 *  9/2018  Tokars ................... G01P 21/00
2004/0119548 A1   6/2004  Karlquist

OTHER PUBLICATIONS

French Search Report; priority document, dated Nov. 2018.
A. Zjajo, et al., "BIST Method for Die-Level Process Parameter Variation Monitoring in Analog/Mixed-Signal Integrated Circuits" EDAA 2007.

* cited by examiner

*Primary Examiner* — Vineeta S Panwalkar
(74) *Attorney, Agent, or Firm* — Greer, Burns & Crain, Ltd.

(57) ABSTRACT

A monitoring device comprising a monitoring pattern signal generating module, a calibration pattern signal generating module, a mixer module for mixing an input signal with the monitoring pattern signal and the calibration pattern signals, a recognition module configured to recognize the monitoring pattern signal, at least one calculation module for calculating at least one offset error and at least one gain error, a transmission module for transmitting a signal of proper operation or of faulty operation to a user device depending on whether the monitoring pattern signal is recognized or not recognized by the recognition module and a transmission module for transmitting a signal representative of the offset error and a signal representative of the gain error.

8 Claims, 2 Drawing Sheets

DEVICE AND METHOD FOR MONITORING AND CALIBRATING A SYSTEM FOR ACQUIRING AND/OR TRANSMITTING DATA

CROSS-REFERENCES TO RELATED APPLICATIONS

This application claims the benefit of the French patent application No. 1854293 filed on May 23, 2018, the entire disclosures of which are incorporated herein by way of reference.

FIELD OF THE INVENTION

The present invention relates to the field of acquisition and transmission of data. In particular, it relates to a device making it possible to monitor proper connection and proper operation of a data acquisition and/or transmission system. The device also makes it possible to verify proper calibration of the acquisition and/or transmission system.

BACKGROUND OF THE INVENTION

In the field of data acquisition and transmission, data acquisition and/or transmission systems, such as data concentrators and electronic input or output boards, play significant roles. Indeed, electronic systems process very significant quantities of data, thus leading these electronic systems to use large quantities of data and to transmit large quantities of data.

For avionics systems, especially, monitoring the input signal of a system has a significant safety aspect. Large numbers of tests are usually carried out during the power-on self-test phase by using very bulky integrated electronic test systems. Moreover, these electronic test systems must also be monitored. These tests take a long time and reduce the quantity of electronic boards available for the integration of functions.

SUMMARY OF THE INVENTION

An object of the present invention is to alleviate these drawbacks by proposing a device for monitoring a data acquisition and/or transmission system.

To this effect, the invention relates to a device for monitoring a data acquisition system intended to supply data to an electrical system and/or for monitoring a data transmission system intended to emit data originating from an electrical system, the acquisition and/or transmission system being configured to be supplied with an input signal and to emit an output signal, the output signal being related to the input signal by a transfer function specific to the acquisition and/or transmission system.

According to the invention, the monitoring device comprises:

at least one monitoring signal generating module, configured to generate a monitoring pattern signal;

at least one calibration signal generating module, configured to generate at least two calibration pattern signals, at least one mixer module, configured to mix at least the input signal with the monitoring pattern signal and the at least two calibration pattern signals so as to obtain a mixed signal;

at least one supply module, configured to supply the acquisition and/or transmission system with the mixed signal;

at least one reception module, configured to receive a mixed output signal emitted by the acquisition and/or transmission system supplied with the mixed signal;

a recognition module, configured to recognize the monitoring pattern signal in the mixed output signal;

at least one calculation module, configured to calculate at least one offset error and at least one gain error on the basis of the transfer function specific to the acquisition and/or transmission system and of the mixed output signal emitted by the acquisition and/or transmission system supplied with the mixed signal;

a first transmission module, configured to transmit to a user device, alternatively:

a signal representative of proper operation, if the recognition module recognizes the monitoring pattern signal, or a signal representative of faulty operation, if the recognition module does not recognize the monitoring pattern signal;

a second transmission module, configured to transmit to the user device a signal representative of the offset error and a signal representative of the gain error.

Thus, by virtue of the invention, an acquisition and/or transmission system can be monitored without requiring means which are bulky and complex to put in place. The recognition module makes it possible to ensure that the monitoring pattern signal is indeed present in the signal exiting the acquisition and/or transmission system supplied with the mixed signal. The calculation module makes it possible to be sure of the proper calibration of the acquisition and/or transmission system.

Moreover, the monitoring pattern signal possesses at least one of the following properties:

the monitoring pattern signal exhibits an energy less than a maximum energy predetermined by the acquisition and/or transmission system;

the monitoring pattern signal exhibits a frequency span different from a frequency span predetermined by the acquisition and/or transmission system;

the monitoring pattern signal exhibits a shape of quasi-Dirac autocorrelation function.

Furthermore, the monitoring pattern signal corresponds to a signal with frequency modulation.

Moreover, the calibration pattern signals correspond to alternate signals.

According to a particular feature, the recognition module is configured to calculate a cross-correlation between the mixed output signal and the monitoring pattern signal, and as a function of this calculation:

the recognition module generates a signal of proper operation if the cross-correlation is greater than a predetermined threshold, the recognition module generates a signal of faulty operation if the cross-correlation is less than or equal to the predetermined threshold.

According to another particular feature, the monitoring device furthermore comprises:

an acquisition module configured to acquire the output signal related to the input signal by the transfer function specific to the acquisition and/or transmission system on the basis of the mixed output signal;

a third transmission module, configured to transmit to the user device the output signal acquired by the acquisition module.

The invention also relates to a method for monitoring a data acquisition system intended to supply data to an electrical system and/or for monitoring a data transmission system intended to emit data originating from an electrical system, the acquisition and/or transmission system being configured to be supplied with an input signal and to emit an output signal, the output signal being related to the input signal by a transfer function specific to the acquisition and/or transmission system.

According to the invention, the monitoring method comprises the following steps:

a monitoring signal generating step, implemented by at least one monitoring signal generating module, consisting in generating a monitoring pattern signal;

a calibration signal generating step, implemented by at least one calibration signal generating module, consisting in generating at least two calibration pattern signals;

a mixing step, implemented by at least one mixer module, consisting in mixing at least the input signal with the monitoring pattern signal and the at least two calibration pattern signals so as to obtain a mixed signal;

a supply step, implemented by at least one supply module, consisting in supplying the acquisition and/or transmission system with the mixed signal;

a reception step, implemented by at least one reception module, consisting in receiving a mixed output signal emitted by the acquisition and/or transmission system supplied with the mixed signal;

a recognition step, implemented by a recognition module, consisting in recognizing the monitoring pattern signal in the mixed output signal;

a calculation step, implemented by at least one calculation module, consisting in calculating at least one offset error and at least one gain error on the basis of the transfer function of the acquisition and/or transmission system and of the mixed output signal emitted by the acquisition and/or transmission system supplied with the mixed signal;

a first transmission step, implemented by a first transmission module, consisting in transmitting to a user device, alternatively:

a signal representative of proper operation, if the monitoring pattern signal is recognized in the recognition step, or, a signal representative of faulty operation, if the monitoring pattern signal is not recognized in the recognition step;

a second transmission step, implemented by a second transmission module, consisting in transmitting to the user device a signal representative of the offset error and a signal representative of the gain error.

According to a particular feature, the method furthermore comprises:

an acquisition step, implemented by an acquisition module, consisting in acquiring the output signal related to the input signal by the transfer function specific to the acquisition and/or transmission system on the basis of the mixed output signal;

a third transmission step, implemented by a third transmission module, consisting in transmitting the output signal acquired during the acquisition step.

BRIEF DESCRIPTION OF THE DRAWINGS

The invention, with its features and advantages, will become more clearly apparent on reading the description given with reference to the appended drawings in which.

DETAILED DESCRIPTION OF THE PREFERRED EMBODIMENTS

The subsequent description will refer to the figures cited hereinabove.

Figure 1:
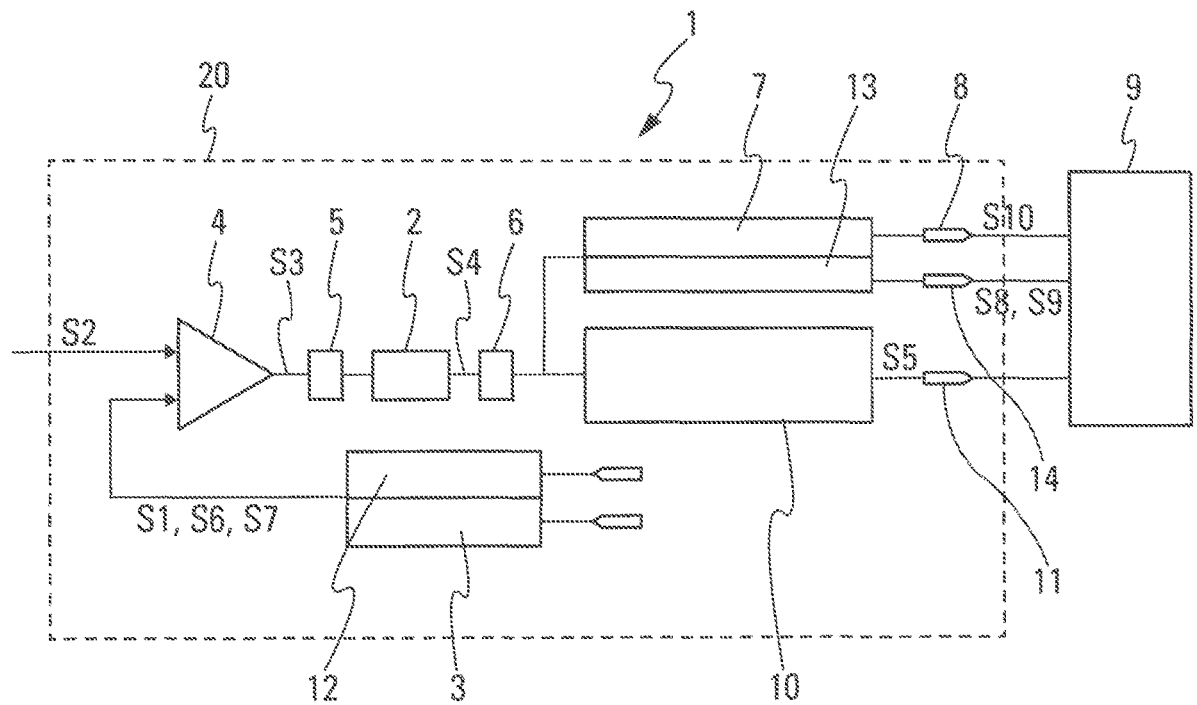
FIG. 1 schematically represents the monitoring device according to a first embodiment, FIG. 2 schematically represents the monitoring device according to a first variant of a second embodiment, FIG. 3 schematically represents the monitoring device according to a second variant of the second embodiment, FIG. 4 schematically represents the steps of the monitoring method.
Figure 3:
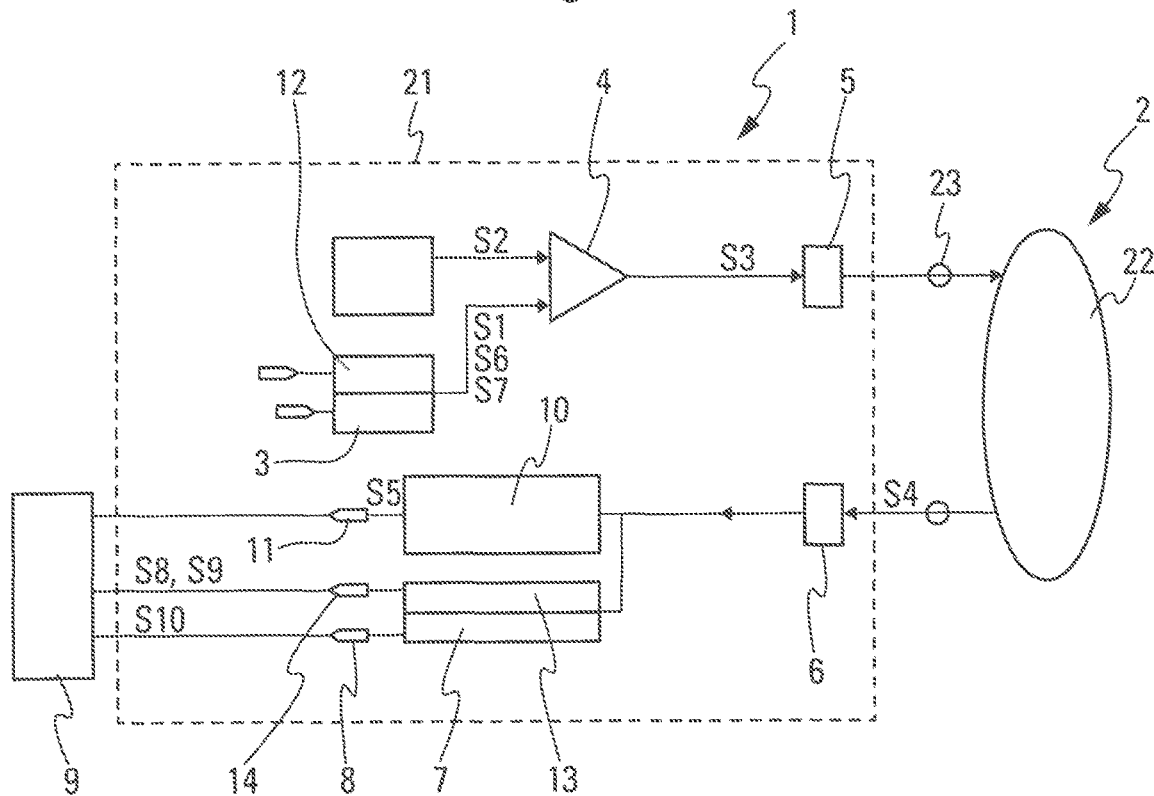
Figure 4:
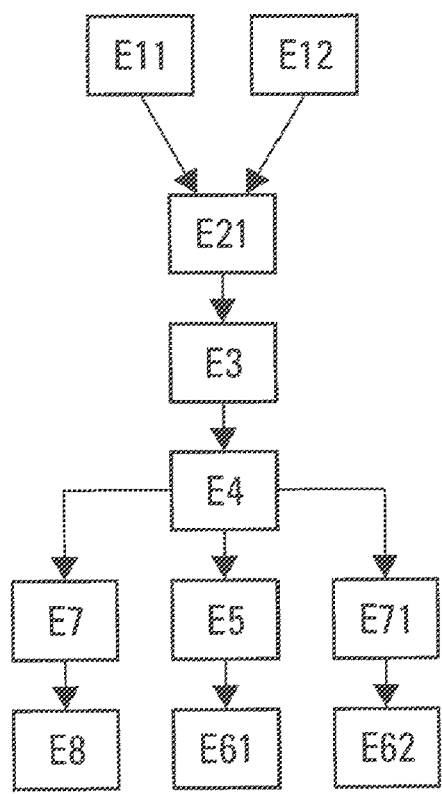
Figure 2:
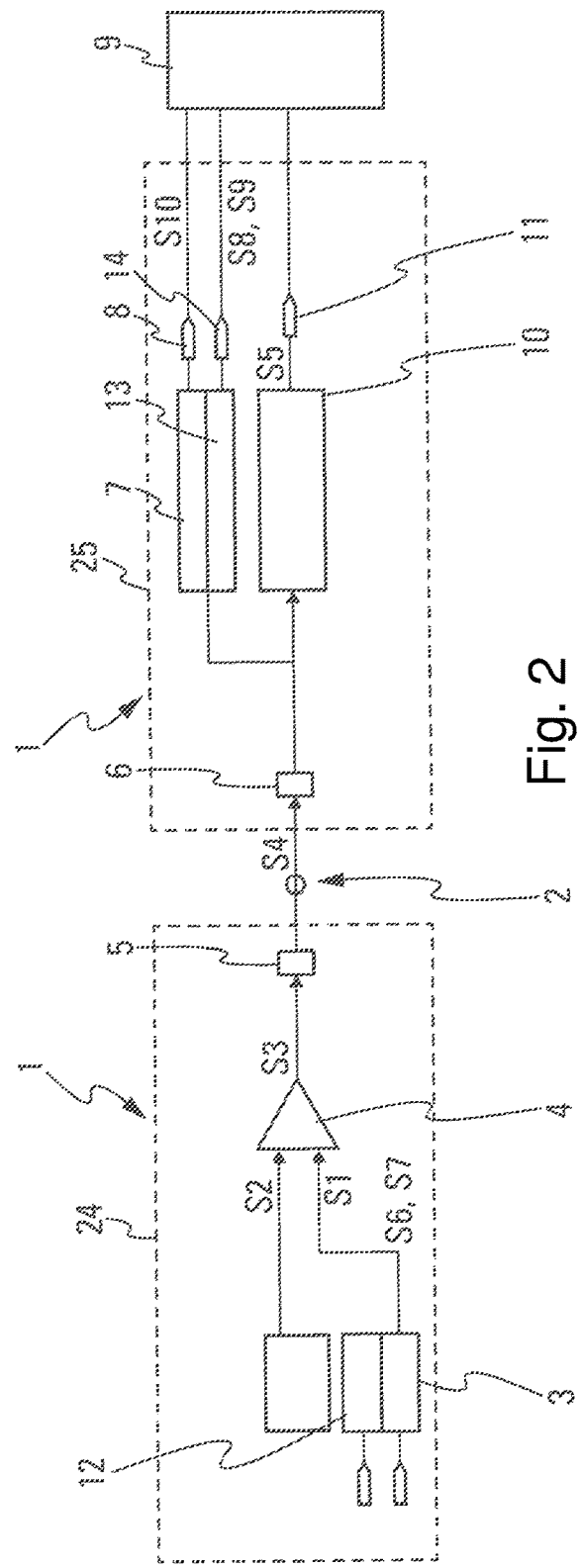

The invention relates to a monitoring device 1 intended to monitor a data acquisition system 2 ("acquisition system 2" hereinafter) intended to supply data to an electrical system and/or a data transmission system 2 ("transmission system 2" hereinafter) intended to emit data originating from an electrical system (FIGS. 1, 2 and 3).

The acquisition system 2 and/or the transmission system 2 correspond, for example, to a data concentrator or to an electronic input or output board. It may comprise, for example, analog-digital conversion circuits or digital-analog conversion circuits.

The acquisition and/or transmission system 2 is configured to be supplied with an input signal S2 and to emit an output signal S5.

The output signal of the acquisition system 2 may correspond to the signal which supplies the electrical system.

The output signal S5 is related to the input signal S2 by a transfer function specific to the acquisition and/or transmission system 2. Generally, the transfer function corresponds to a mathematical representation of a relation between the Laplace transform of the input signal S2 and the Laplace transform of the output signal S5 of an invariant linear system or one which varies very slowly over time. The linear system variations may be due to environmental conditions.

The monitoring device 1 comprises at least one monitoring signal generating module 3, configured to generate a monitoring pattern signal S1. The monitoring signal generating module 3 can also generate several monitoring pattern signals S1.

Advantageously, the monitoring pattern signal S1 exhibits at least one energy less than a maximum energy predetermined by the acquisition and/or transmission system 2. The predetermined maximum energy corresponds to the maximum energy that the monitoring pattern signal S1 can exhibit without it being blocked by the acquisition and/or transmission system 2 and without it disturbing the dynamics of the input signal S2.

Likewise, the monitoring pattern signal S1 can also exhibit a frequency span different from a frequency span predetermined by the acquisition and/or transmission system 2. The predetermined frequency span corresponds to the span of operating frequencies of the acquisition and/or transmission system 2. Thus, the monitoring pattern signal S1 exhibits a frequency span which makes it possible to avoid interference with the span of operating frequencies of the acquisition and/or transmission system 2.

Furthermore, the monitoring pattern signal S1 can exhibit a shape of quasi-Dirac autocorrelation function.

The monitoring pattern signal S1 can correspond to a signal with frequency modulation or otherwise referred to as a "chirp signal." A chirp signal corresponds, for example, to a pseudoperiodic signal, frequency modulated around a carrier frequency and also amplitude modulated by an envelope whose variations are slow with respect to the oscillations of the phase.

The monitoring device 1 furthermore comprises at least one calibration signal generating module 12, configured to generate at least two calibration pattern signals S6, S7.

The monitoring device 1 also comprises at least one mixer module 4 configured to mix at least the input signal S2 with the monitoring pattern signal S1 and the at least two calibration pattern signals S6, S7 so as to obtain a first mixed signal S3.

The mixer module 4 can be configured to add together at least the input signal S2, the monitoring pattern signal S1, a calibration pattern signal S6 and a calibration pattern signal S7. The mixed signal S3 then corresponds to the sum at least of the input signal S2, of the monitoring pattern signal S1, of the calibration pattern signal S6 and of the calibration pattern signal S7.

The monitoring device 1 furthermore comprises:

at least one supply module 5, configured to supply the acquisition and/or transmission system 2 with the mixed signal S3;

at least one reception module 6, configured to receive a mixed output signal S4 emitted by the acquisition and/or transmission system 2 supplied with the mixed signal S3.

The monitoring device 1 comprises, also, a recognition module 7, configured to recognize the monitoring pattern signal S1 in the mixed output signal S4.

For example, a signal has specific features. The recognition of said signal can come down to find said specific features in a given signal.

The monitoring device 1 also comprises at least one calculation module 13, configured to calculate at least one offset error and at least one gain error on the basis of the transfer function specific to the acquisition and/or transmission system 2 and of the mixed output signal S4 emitted by the acquisition and/or transmission system 2 supplied with the mixed signal S3.

The monitoring device 1 comprises, also, a transmission module 8 and a transmission module 14.

The transmission module 8 is configured to transmit to a user device 9, alternatively:

a signal representative of proper operation S10, if the recognition module 7 recognizes the monitoring pattern signal S1, or, a signal representative of faulty operation S10, if the recognition module 7 does not recognize the monitoring pattern signal S1.

The transmission module 14 is configured to transmit to the user device 9 a signal representative of the offset error S8 and a signal representative of the gain error S9.

The user device 9 can comprise a display screen which displays a symbol or an expression indicating the proper operation of the acquisition and/or transmission system 2 if the signal S10 received by the user device 9 corresponds to a signal representative of proper operation S10. Another symbol or another expression can be displayed on the display screen if the signal S10 received by the user device 9 corresponds to a signal representative of faulty operation S10.

The monitoring device 1 can also comprise:

an acquisition module 10 configured to acquire the output signal S5 related to the input signal S2 by the transfer function specific to the acquisition and/or transmission system 2 on the basis of the mixed output signal S4;

a transmission module 11, configured to transmit to the user device 9 the output signal S5 acquired by the acquisition module 10.

The output signal S5 acquired by the acquisition module 10 makes it possible to supply the electrical system or to transmit the signal originating from the electrical system.

Advantageously, the recognition module 7 is configured to calculate a cross-correlation between the mixed output signal S4 and the monitoring pattern signal S1. The recognition module 7 generates a signal of proper operation S10 if the cross-correlation is substantially greater than a predetermined threshold. In this case, this signifies that the result of the cross-correlation exhibits an appreciable value indicating the presence of the monitoring pattern signal S1. The recognition module 7 generates a signal of faulty operation S10 if the cross-correlation is substantially less than or equal to the predetermined threshold.

The calibration pattern signals S8, S9 correspond, for example, to alternate signals.

Preferably, to calibrate the acquisition and/or transmission system 2, the monitoring signal generating module or modules 3 does or do not generate any monitoring pattern signal S1 when the calibration signal generating module or modules 12 generates or generate the calibration pattern signals S6, S7.

The calculation module 13 makes it possible to determine at least one offset error and at least one gain error on the basis of a system of two equations with two unknowns by virtue of the two calibration pattern signals S6 and S7. The unknowns of the system of equations correspond to the offset error and to the gain error.

FIG. 1 represents the monitoring device 1 according to a first embodiment. In this embodiment, the monitoring device 1 is integrated into a unit 20 comprising the acquisition and/or transmission system 2. For example, the monitoring device 1 and the acquisition and/or transmission system 2 are included on one and the same electronic board.

FIG. 2 represents the monitoring device 1 according to a first variant of a second embodiment. In this variant, the monitoring device 1 is distributed in two electronic devices 24, 25 separate from the acquisition and/or transmission system 2. A first device 24 allows the mixing of the input signal S2 with the monitoring pattern signal S1 and the at least two calibration pattern signals S6, S7 so as to supply the acquisition and/or transmission system 2. A second electronic device 25 allows the recognition of the monitoring pattern signal S1 and the determination of the offset error and of the gain error. For example, the first device 24 is included on a first electronic board and the second device 25 is included on a second electronic board.

FIG. 3 represents the monitoring device 1 according to a second variant of the second embodiment. In this variant, the monitoring device 1 is contained in an electronic device 21 separate from the acquisition and/or transmission system 2. For example, this monitoring device 1 allows continuous monitoring, in a functional-loop mode of operation, of a sensor 22, of wiring 23 and of circuits for analog-digital conversion and/or digital-analog conversion.

The invention also relates to a method for monitoring a data acquisition system intended to supply data to an electrical system and/or for monitoring a data transmission system intended to emit data originating from an electrical system.

The monitoring method comprises the following steps:

a monitoring signal generating step E11, implemented by the monitoring signal generating module or modules 3, comprising generating a monitoring pattern signal S1;

a calibration signal generating step E12, implemented by at least one calibration signal generating module 12, comprising generating at least two calibration pattern signals S6, S7, a mixing step E21, implemented by the first mixer module or modules 4, comprising mixing at least the input signal S2 with the monitoring pattern signal S1 and the at least two calibration pattern signals S6, S7 so as to obtain a mixed signal S3;

a supply step E3, implemented by the supply module or modules 5, comprising supplying the acquisition and/or transmission system 2 with the mixed signal S3;

a reception step E4, implemented by the reception module or modules 6, comprising receiving a mixed output signal S4 emitted by the acquisition and/or transmission system 2 supplied with the mixed signal S3;

a recognition step E5, implemented by the recognition module 7, comprising recognizing the monitoring pattern signal S1 in the mixed output signal S4;

a calculation step E71, implemented by the calculation module or modules 13, comprising calculating at least one offset error and at least one gain error on the basis of the transfer function of the acquisition and/or transmission system 2 and of the mixed output signal S4 emitted by the acquisition and/or transmission system 2 supplied with the mixed signal S3;

a transmission step E61, implemented by the transmission module 8, comprising transmitting to the user device 9, alternatively:

a signal representative of proper operation S10, if the monitoring pattern signal S1 is recognized in the recognition step E5, or, a signal representative of faulty operation S10, if the monitoring pattern signal S1 is not recognized in the recognition step E5;

a transmission step E62, implemented by the transmission module 14, comprising transmitting to the user device 9 a signal representative of the offset error S8 and a signal representative of the gain error S9.

The monitoring method can also comprise the following steps:

an acquisition step E7, implemented by the acquisition module 10, comprising acquiring the output signal S5 related to the input signal S2 by the transfer function specific to the acquisition and/or transmission system 2 on the basis of the mixed output signal S4;

a transmission step E8, implemented by the transmission module 11, comprising transmitting to the user device 9 the output signal S5 acquired during the acquisition step E7.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A device for at least one of monitoring a data acquisition system configured to supply data to an electrical system or monitoring a data transmission system configured to emit data originating from an electrical system, the data acquisition or data transmission system being configured to be supplied with an input signal and to emit an output signal, the output signal being related to the input signal by a transfer function specific to the data acquisition or data transmission system, comprising:

at least one monitoring signal generating module, configured to generate a monitoring pattern signal;

at least one calibration signal generating module, configured to generate at least two calibration pattern signals, at least one mixer module, configured to mix at least the input signal with the monitoring pattern signal and the at least two calibration pattern signals so as to obtain a mixed signal;

at least one supply module, configured to supply the data acquisition or data transmission system with the mixed signal;

at least one reception module, configured to receive a mixed output signal emitted by the data acquisition or data transmission system supplied with the mixed signal;

a recognition module, configured to recognize the monitoring pattern signal in the mixed output signal;

at least one calculation module, configured to calculate at least one offset error and at least one gain error on a basis of the transfer function specific to the data acquisition or data transmission system and of the mixed output signal emitted by the data acquisition or data transmission system supplied with the mixed signal;

a first transmission module, configured to transmit to a user device, alternatively:

a signal representative of proper operation, if the recognition module recognizes the monitoring pattern signal, or, a signal representative of faulty operation, if the recognition module does not recognize the monitoring pattern signal;

a second transmission module, configured to transmit to the user device a signal representative of the offset error and a signal representative of the gain error.

2. The device as claimed in claim 1, wherein the monitoring pattern signal possesses at least one of the following properties:

the monitoring pattern signal exhibits an energy less than a maximum energy predetermined by at least one of the data acquisition or data transmission system;

the monitoring pattern signal exhibits a frequency span different from a frequency span predetermined by at least one of the data acquisition or data transmission system;

the monitoring pattern signal exhibits a shape of quasi-Dirac autocorrelation function.

3. The device as claimed in claim 1, wherein the monitoring pattern signal corresponds to a signal with frequency modulation.

4. The device as claimed in claim 1, wherein the calibration pattern signals correspond to alternate signals.

5. The device as claimed in claim 1, wherein the recognition module is configured to calculate a cross-correlation between the mixed output signal and the monitoring pattern signal, and as a function of this calculation:

the recognition module generates a signal of proper operation if the cross-correlation is greater than a predetermined threshold, the recognition module generates a signal of faulty operation if the cross-correlation is less than or equal to the predetermined threshold.

6. The device as claimed in claim 1, furthermore comprising:

an acquisition module configured to acquire the output signal related to the input signal by the transfer function specific to at least one of the data acquisition or data transmission system on a basis of the mixed output signal;

a third transmission module, configured to transmit to the user device the output signal acquired by the acquisition module.

7. A method for monitoring at least one of a data acquisition system configured for supplying data to an electrical system or a data transmission system configured to emit data originating from an electrical system, the data acquisition system or data transmission system being configured to be supplied with an input signal and to emit an output signal, the output signal being related to the input signal by a transfer function specific to at least one of the data acquisition or data transmission system, wherein the method comprises the following steps:

generating a monitoring signal implemented by at least one monitoring signal generating module, comprising generating a monitoring pattern signal;

generating a calibration signal implemented by at least one calibration signal generating module, comprising generating at least two calibration pattern signals;

mixing at least the input signal with the monitoring pattern signal and the at least two calibration pattern signals by at least one mixer module so as to obtain a mixed signal;

supplying the at least one of the data acquisition system or data transmission system with the mixed signal by at least one supply module;

receiving a mixed output signal emitted by the at least one of the data acquisition system or data transmission system supplied with the mixed signal by at least one reception module;

recognizing the monitoring pattern signal in the mixed output signal by a recognition module;

calculating at least one offset error and at least one gain error on a basis of the transfer function of the at least one data acquisition system or data transmission system and of the mixed output signal emitted by the at least one of the data acquisition system or data transmission system supplied with the mixed signal by at least one calculation module;

transmitting to a user device in a first transmission step, implemented by a first transmission module, alternatively:
   a signal representative of proper operation, if the monitoring pattern signal is recognized in the recognition step, or,
   a signal representative of faulty operation, if the monitoring pattern signal is not recognized in the recognition step;

transmitting to the user device in a second transmission step, implemented by a second transmission module, a signal representative of the offset error and a signal representative of the gain error.

8. The method as claimed in claim 7, furthermore comprising:

acquiring the output signal related to the input signal by the transfer function specific to the at least one of the data acquisition system or data transmission system on a basis of the mixed output signal by an acquisition module;

transmitting the output signal acquired during the acquisition step in a third transmission step, implemented by a third transmission module, comprising transmitting the output signal acquired during the acquisition step.

* * * * *